(12) United States Patent
She et al.

(10) Patent No.: US 11,848,281 B2
(45) Date of Patent: *Dec. 19, 2023

(54) DIE STACK WITH REDUCED WARPAGE

(71) Applicant: Intel Corporation, Santa Clara, CA (US)

(72) Inventors: Yong She, Songjiang (CN); Bin Liu, Shanghai (CN); Zhicheng Ding, Shanghai (CN); Aiping Tan, Shanghai (CN)

(73) Assignee: Intel Corporation, Santa Clara, CA (US)

(*) Notice: Subject to any disclaimer, the term of this patent is extended or adjusted under 35 U.S.C. 154(b) by 74 days.

This patent is subject to a terminal disclaimer.

(21) Appl. No.: 17/391,612

(22) Filed: Aug. 2, 2021

(65) Prior Publication Data

US 2022/0020704 A1 Jan. 20, 2022

Related U.S. Application Data

(63) Continuation of application No. 16/492,323, filed as application No. PCT/CN2017/076286 on Mar. 10, 2017, now Pat. No. 11,081,451.

(51) Int. Cl.
*H01L 23/00* (2006.01)
*H01L 25/065* (2023.01)
(Continued)

(52) U.S. Cl.
CPC .............. *H01L 23/562* (2013.01); *G11C 5/04* (2013.01); *H01L 24/29* (2013.01);
(Continued)

(58) Field of Classification Search
CPC ... H01L 23/562; H01L 24/29; H01L 25/0657; H01L 27/11524; H01L 27/1157; H01L 2924/1438; H01L 2924/3511; H01L 24/32; H01L 24/48; H01L 24/73; H01L 24/83; H01L 23/49816; H01L 24/45; H01L 2224/32225; H01L 2224/45144;
(Continued)

(56) References Cited

U.S. PATENT DOCUMENTS 5,751,552 A 5/1998 Scanlan et al.
11,081,451 B2 * 8/2021 She .......................... G11C 5/04
(Continued)

FOREIGN PATENT DOCUMENTS

CN 105931997 A 9/2016
WO WO-2018161347 A1 9/2018

OTHER PUBLICATIONS

"U.S. Appl. No. 16/492,323, Non Final Office Action dated Oct. 15, 2020", 26 pgs.
(Continued)

*Primary Examiner* — Herve-Louis Y Assouman
(74) *Attorney, Agent, or Firm* — Akona IP

(57) ABSTRACT

A microelectronic device can include a polymer, a semiconductor, and a matching layer. The polymer can include a first coefficient of thermal expansion. The semiconductor can be coupled to the polymer layer. The matching layer can be adjacent the semiconductor, and the matching layer can include a second coefficient of thermal expansion that is about the same as the first coefficient of thermal expansion.

18 Claims, 6 Drawing Sheets

(51) Int. Cl.
    *H01L 23/498*     (2006.01)
    *G11C 5/04*     (2006.01)
    *H10B 41/35*     (2023.01)
    *H10B 43/35*     (2023.01)

(52) U.S. Cl.
    CPC ......... *H01L 25/0657* (2013.01); *H10B 41/35* (2023.02); *H10B 43/35* (2023.02); *H01L 2924/1438* (2013.01); *H01L 2924/3511* (2013.01)

(58) Field of Classification Search
    CPC ....... H01L 2224/45169; H01L 23/3128; H01L 23/49827; H01L 2224/32145; H01L 2224/45139; H01L 2224/45147; H01L 2224/48091; H01L 2224/48227; H01L 2224/73265; H01L 2224/83191; H01L 2924/1434; H01L 2924/15311; H01L 2924/181; H01L 23/31
    See application file for complete search history.

(56) References Cited

U.S. PATENT DOCUMENTS

| | | |
|---|---|---|
| 2004/0125563 A1 | 7/2004 | Vrtis |
| 2004/0156172 A1 | 8/2004 | Lin et al. |
| 2004/0163843 A1* | 8/2004 | Shin .................... H01L 23/3135 174/254 |
| 2008/0054432 A1 | 3/2008 | Corisis et al. |
| 2008/0142956 A1* | 6/2008 | Cambou ................ H01L 24/32 257/723 |
| 2010/0002406 A1 | 1/2010 | Hsu |
| 2011/0221069 A1 | 9/2011 | Kunimoto |
| 2013/0075895 A1* | 3/2013 | Miura .................... H01L 24/94 257/737 |
| 2014/0264910 A1* | 9/2014 | Razdan ................. H01L 23/528 257/774 |
| 2016/0013148 A1 | 1/2016 | Lin et al. |
| 2020/0051929 A1 | 2/2020 | She et al. |

OTHER PUBLICATIONS

"U.S. Appl. No. 16/492,323, Notice of Allowance dated Apr. 2, 2021", 10 pgs.

"U.S. Appl. No. 16/492,323, Preliminary Amendment filed Sep. 9, 2019", 7 pgs.

"U.S. Appl. No. 16/492,323, Response filed Feb. 16, 2021 to Non Final Office Action dated Oct. 15, 2020", 12 pgs.

"International Application Serial No. PCT/CN2017/076286, International Search Report dated Nov. 29, 2017", 4 pgs.

"International Application Serial No. PCT/CN2017/076286, Written Opinion dated Nov. 29, 2017", 4 pgs.

\* cited by examiner

DIE STACK WITH REDUCED WARPAGE

PRIORITY

This application is a continuation of U.S. patent Ser. No. 16/492,323, filed Sep. 9, 2019, which is a U.S. National Stage Application under 35 U.S.C. 371 from International Application No. PCT/CN2017/076286, filed Mar. 10, 2017, and published as WO 2018/161347 on Sep. 13, 2018, all of which are hereby incorporated by reference in their entirety.

TECHNICAL FIELD

Embodiments described herein generally relate to memory modules.

BACKGROUND

To create memory modules having a greater storage capacity, memory packages may include NAND dies that are in a stacked configuration, coupled to a substrate, conductively connected to the substrate, and protectively enclosed. Stacked NAND memory offers the benefit of providing a greater storage capacity for a given space. However, physically stacking NAND dies can create manufacturing and production problems that adversely affect speed, efficiency, and reliability of the memory module.

DETAILED DESCRIPTION

Figure 1:
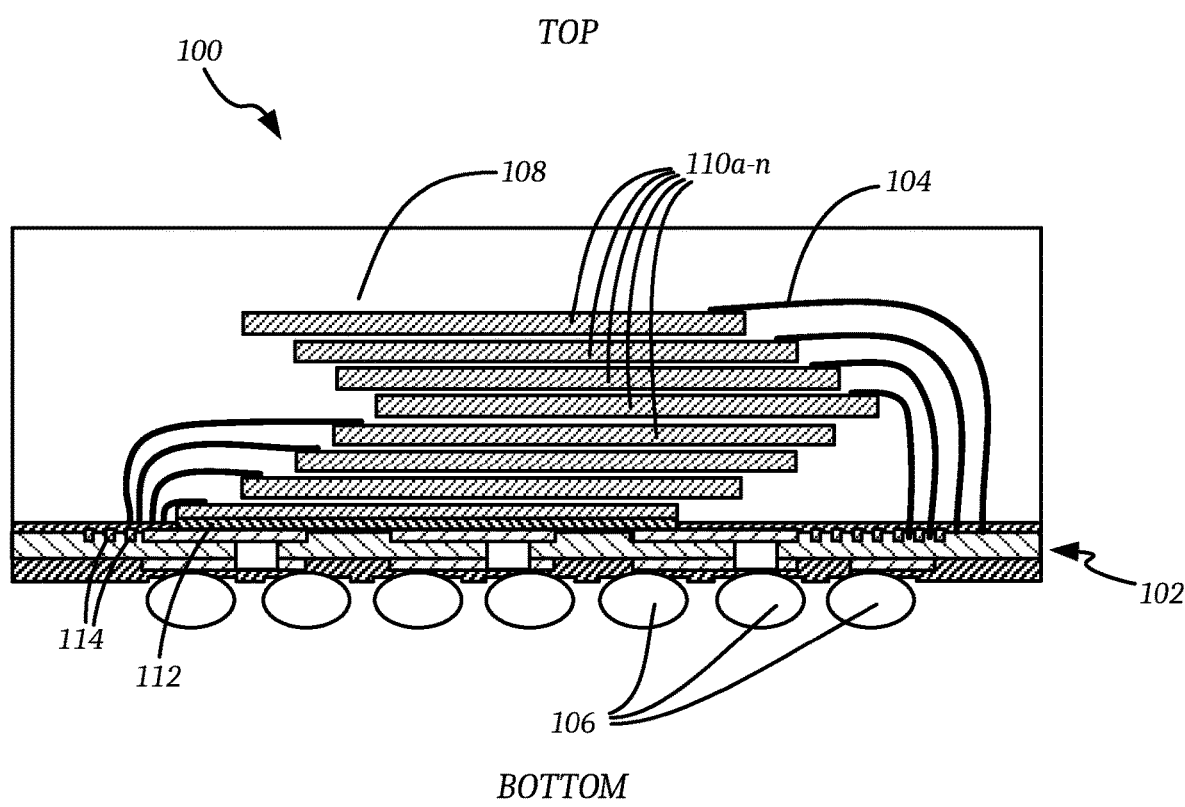
FIG. 1 illustrates an elevation view of a package, in accordance with at least one example of the present disclosure.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

In one example, a microelectronic device can include a polymer, a semiconductor, and a matching layer. The polymer can include a first coefficient of thermal expansion. The semiconductor can be coupled to the polymer layer. The matching layer can be adjacent the semiconductor, and the matching layer can include a second coefficient of thermal expansion that is about the same as the first coefficient of thermal expansion.

In another example, a microelectronic device can include a polymer layer, a semiconductor, a signal distribution layer, and a matching layer. The semiconductor can be spaced from the polymer layer. The signal distribution layer can be disposed between the polymer layer and the semiconductor. The signal distribution layer can include a first coefficient of thermal expansion. The matching layer can be adjacent the semiconductor opposite the signal distribution layer. The matching layer can include a second coefficient of thermal expansion that is about the same as the first coefficient of thermal expansion.

In yet another example, a microelectronic device package can include a substrate, a plurality of NAND modules, and an encapsulation layer. The substrate can include a plurality of conductive elements. The plurality of NAND modules can be oriented in a stacked configuration relative to the substrate. Each NAND module can be electrically connected to one of the plurality of conductive elements. Each NAND module can include a polymer layer, a semiconductor, a signal distribution layer, and a matching layer. The polymer layer can include a first coefficient of thermal expansion. The signal distribution layer can be disposed between the semiconductor and the polymer layer. The signal distribution layer can include a second coefficient of thermal expansion. The matching layer can be adjacent the semiconductor and opposite the signal distribution layer. The matching layer can include a third coefficient of thermal expansion that can be about the same as one or more of the first coefficient of thermal expansion and the second coefficient of thermal expansion. The encapsulation layer can enclose the plurality of NAND modules.

In yet another example, a method of forming a microelectronic device can include providing a wafer including a polymer layer having a first coefficient of thermal expansion, a distribution layer including a second coefficient of thermal expansion, and a semiconductor. The semiconductor can be coated with a material having a third coefficient of thermal expansion that is about the same as one or more of the first coefficient of thermal expansion and the second coefficient of thermal expansion. The material can be cured.

In some integrated circuit packages, dies can be in a stacked configuration, providing the benefit of greater storage capacity for a given space. However, physically stacking dies can create manufacturing and production problems that adversely affect speed, efficiency, and reliability of the memory module. For example, a common issue is die warpage, or warpage of individual dies. Warped dies can cause non-sticking of components, such as conductors, resulting generally in loss of manufacturing yield. In some examples warping may cause wires not to bond between dies and in other examples warping may cause wires to not bond between dies and a substrate.

The inventors have discovered, among other things, that warpage of individual dies can be caused by difference or mismatch in coefficients of thermal expansion between different layers of dies. The inventors have proposed, in some examples, to reduce warpage of dies by including an additional layer within or applied to each die. The additional layer can have a coefficient of thermal expansion that matches one or more of the other layers within each die. By selecting a matching layer having a coefficient of thermal expansion that substantially matches one or more other layers of the die, die warpage can be substantially reduced, in some cases up to 50% or more. This can help ensure successful wire bonding, providing an increase in manufacturing yield, saving cost and time. Further, a reduction in warpage can enable higher stacking of thin dies for a given package, which can increase speed and/or capacity of the package.

FIG. 1 illustrates an elevation view of package 100 in accordance with at least one example of the present disclosure. Package 100 can include substrate 102, conductors 104, ball grid array 106, encapsulation 108, dies 110a-n (dies 110), adhesive 112, and contacts 114. Also shown in FIG. 1 are orientation indicators Top and Bottom. Though the examples below may be described with reference to orientation indications Top and Bottom, the examples are not so limited as being oriented relative to any bodies having typically similar references, such as the earth or ground.

In some examples, package 100 can be a volatile or non-volatile memory module, such as a NAND package, comprised of many individual dies, each configured to store and route signals for the purpose of storing data. In operation of some examples, package 102 can form a portion of a memory module, processor, and the like, configured to manage, route, and store signals.

Substrate 102 can be a board, such as an integrated circuit board, including transistors and circuits of any of multiple forms known in the industry, providing conductive structures and contacts, such as contacts 114, to distribute signals. Such conductive structures and contacts in substrate 102 are well known to persons skilled in the art and are therefore not discussed in detail herein.

Dies 110 can be dies comprising logic gates and conductors to form, in some examples, a volatile or non-volatile memory module. In some examples, semiconductors can be non-volatile NAND dies. As shown in FIG. 1, dies 110 can be arranged on substrate 102 in a stacked configuration, where each of dies 110 is stacked on top of another of semiconductors, slightly laterally offset from surrounding dies 110, allowing a first end of each of conductors 104 to connect to each of dies 110. Conductors 104 can be leads, wires, traces, or other conductors capable of transferring electricity. A second end of each of conductors 104 can connect to substrate 102 at one of contacts 114. Conductors 104 can be comprised of conductive materials such as gold, silver, platinum, copper, and the like.

A bottom die 110 can be coupled to substrate 102 by adhesive 112 at a top portion of substrate 102. In some examples, adhesive 112 can be an attach film laminated to one of the substrate or one of dies 110. Further, each of dies 110 can be coupled to surrounding (above and below) dies 110 using an adhesive, such as an attach film, as discussed below. A topmost die 110 may only be coupled to a die 110 adjacently below.

Ball grid array 106 can be an array, such as a grid, of solder balls or other conductive balls attached to a bottom portion of substrate 102 and configured to connect to conductors, traces, wires, and the like.

Encapsulation 108 can be a polymer encapsulation layer, such as an epoxy resin or polyimide. Encapsulation 108 can surround and enclose dies 110, conductors 104, and a top portion of substrate 102. By encapsulating the components of package 102, encapsulation 108 can electrically insulate and can protect the components of package 102.

In the example shown in FIG. 1, dies 110 are in a stacked configuration, providing the benefit of greater storage capacity for a given space. However, physically stacking dies 110 can create manufacturing and production problems that adversely affect speed, efficiency, and reliability of the memory module. For example, a common issue is die warpage.

If dies 110 warp, dies 110 can bounce during processing of package 100, such as during a wire bonding process. Bouncing of dies 110 can cause dies 110 not to bond to conductors 104, also known as non-stick on pad (NSOP). Bouncing of dies 110 can also cause conductors 104 not to bond to contacts 114 (bond fingers), also known as non-stick on lead (NSOL). These issues can cause a significant loss in manufacturing yield. Moreover, warpage of corners of dies 110 can cause separation between dies 110 at their individual adhesives (such as die attach films) and/or at adhesive 112 at substrate 102. This can allow the compounds used to form encapsulation 108 to intrude during the molding process, which can lead to delamination of adhesives and/or scratching of dies 110. The methods discussed below can be used to help reduce warpage and therefore reduce these problems.

Figure 2:
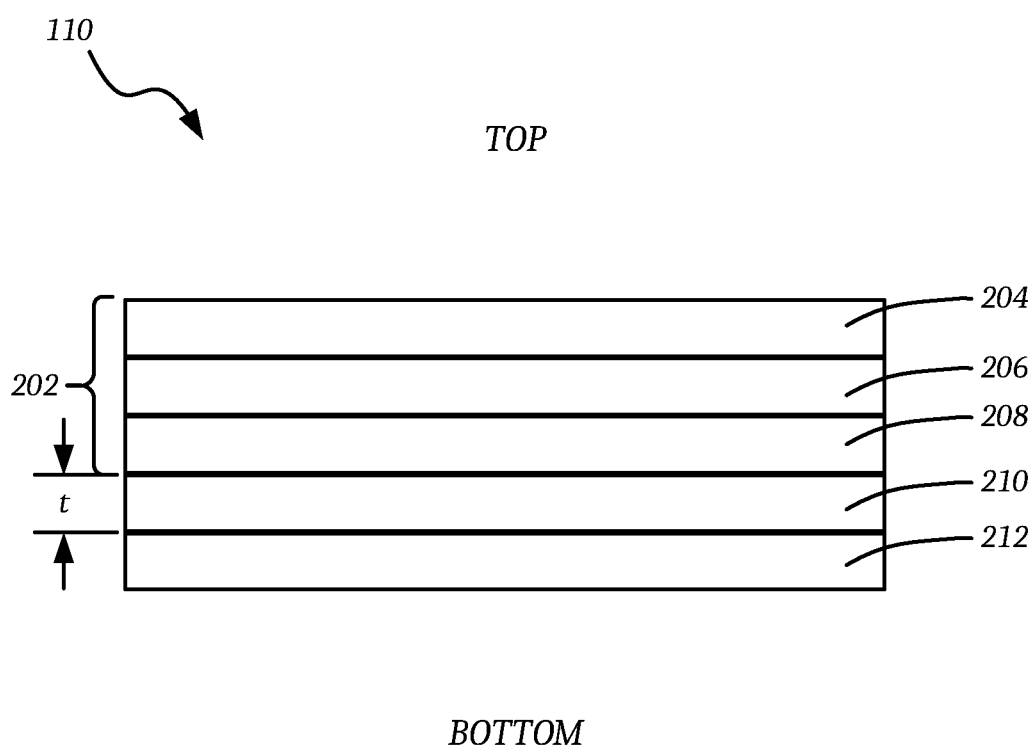
FIG. 2 illustrates an elevation view of a die assembly, in accordance with at least one example of the present disclosure.

FIG. 2 illustrates an elevation view of die 110, in accordance with at least one example of the present disclosure. Die 110 can include microelectronic assembly 202, which can include polymer layer 204, signal distribution layer 206, semiconductor 208, matching layer 210, and adhesive 212. Also shown in FIG. 2 are thickness t of matching layer 210, and orientation indicators Top and Bottom.

Microelectronic assembly 202 can include polymer layer 204, signal distribution layer 206, and semiconductor 208. Semiconductor 208 can include a wafer in some examples and can include an individual chip in other examples. Polymer layer 204 can be comprised of a polymer, such as a polyimide, epoxy resin, and the like. Polymer layer 204 can be coupled to a top side of signal distribution layer, to enclose, insulate, and protect signal distribution layer 206. Signal distribution layer 206 can comprise circuits, traces, and contacts configured to distribute signals, such as electrical signals. Semiconductor 208 can comprise a silicon semiconductor, for example, such as an integrated circuit, configured to operate as a volatile or non-volatile memory module, in some examples.

Adhesive 212 can be an adhesive or bonding agent configured to secure die 110 to other dies 11, as shown in FIG. 1, or to substrate 102, as also shown in FIG. 1. In some examples, adhesive 212 can be an attach film laminated to matching layer 210.

Matching layer 210 can be a polymer, such as an epoxy resin or polyimide, in some examples. Matching layer 210 can be a thin layer, spray-coated or spin-coated (among other processes) for applying coatings, to a bottom side of semiconductor 208. In some examples, matching layer 210 can have a thickness t between 0.5 and 50 microns. In other examples, matching layer 210 can have a thickness t between 3 and 15 microns. In yet other examples, matching layer 210 can have a thickness t of 5-10 microns.

Each layer of die 110 (polymer layer 204, distribution layer 206, semiconductor 208, matching layer 210, and adhesive 212) can have a coefficient of thermal expansion (CTE). In many examples, the CTEs of each layer may not be the same. For example, semiconductor 208 can be comprised mostly of silicon, which can have a CTE of about 2 to 3 parts per million per degree Kelvin (ppm/K), and the other layers, especially polymer layer 204 and distribution layer 206 can have CTEs that are much higher. For example, distribution layer 206 can have a CTE of about 5 to about 20 ppm/K and polymer layer 204 can have a CTE of about 20 to about 30 ppm/K. In such cases, where extensive heating and/or cooling is used, such as during wire bonding, for example, die 110 can warp due to an imbalance of stresses. That is, because distribution layer 206 and polymer layer 204 are bonded to a top side of semiconductor 208, semiconductor 208 may experience a stress on the top side that is significantly different from a stress on the bottom side. This stress imbalance can induce warping in (or smiling of) semiconductor 208 and therefore die 110.

Summarily, the difference between the CTE of semiconductor 208 and polymer layer 204 and/or distribution layer 206 can cause in warping of die 110 during processing. Warping of dies 110 can lead to several costly problems, as discussed above. The present disclosure addresses this problem, in some examples, by including matching layer 210. Matching layer 210 can be selected to be comprised of a material having a CTE that is about the same as one or more of the CTEs of the other layers of die 110 (polymer layer 204, distribution layer 206, semiconductor 208, and adhesive 212). Some specific, non-limiting examples are discussed below.

In some examples, polymer layer 204, being comprised of polymer, can have a CTE of 20 ppm/K. In this example, matching layer 210 can have a substantially similar CTE, such as 18, 19, 20, 21, 22, and the like. In these examples, matching layer 210, being applied to a bottom side of semiconductor 208, can balance out the stresses applied to the top of semiconductor 208 by polymer layer 204 and/or distribution layer 206. This balance of stresses can significantly reduce warpage of semiconductor 208 and therefore die 210, such as by 50% or more, in some examples.

In other examples, polymer layer 204 can have a CTE between 15 and 35 ppm/K. In further examples, polymer layer 204 can have a CTE between 20 and 30 parts per million per degree Kelvin ppm/K. In all of these examples, matching layer 210 can have a substantially similar CTE.

To further reduce warpage of die 110, matching layer can be selected to have a thickness t that, along with a selected CTE, further balances the stresses applied to the top and bottom of semiconductor 208. That is, both the thickness t and the CTE of matching layer 210 can be selected as a function of the thicknesses and CTEs of polymer layer 204, distribution layer 206, and semiconductor 208 to balance the stresses applied to the top and bottom sides of semiconductor 208, reducing warpage of die 110.

In some examples, distribution layer, being comprised partially of conductive materials (as described above), can have a CTE of 15 ppm/K. In this example, matching layer 210 can have a substantially similar CTE, such as 13, 14, 15, 16, 17, and the like. In these examples, matching layer 210, being applied to a bottom side of semiconductor 208, can balance out the stresses applied to the top of semiconductor 208 by polymer layer 204 and/or distribution layer 206. This balance of stresses can significantly reduce warpage of semiconductor 208 and therefore die 210, such as by 50% or more, in some examples.

In other examples, distribution layer 206 can have a CTE between 3 and 25 ppm/K. In further examples, distribution layer 206 can have a CTE between 5 and 20 parts per million per degree Kelvin ppm/K. In all of these examples, matching layer 210 can have a substantially similar CTE.

To further reduce warping of die 110, polymer layer 204 and distribution layer 206 can be selected to have CTEs that are relatively similar to each other, despite being comprised of different materials. For example, polymer layer 204 and distribution layer 206 can have a CTE between about 18 and about 22 ppm/K, such as 20 ppm/K. However, other CTEs can be used in other examples. In some of these examples, matching layer 210 can be selected to have a similar CTE of both polymer layer 204 and distribution layer 206, such as, for example, 20 ppm/K. Matching the CTEs of polymer layer 204, distribution layer 206, and matching layer 210 can further reduce the balance of stresses applied to semiconductor 208, reducing warping of semiconductor 208 and therefore die 110.

In some other examples, though not shown in FIG. 1 or 2, die 110 may consist of additional layers applied between and/or above and/or below the layers shown in FIG. 2. In some of these examples, matching layer 210 can be selected to be of a thickness t and to have a CTE that is substantially the same as the additional layers and/or polymer layer 204 and/or distribution layer 206.

Figure 3A:
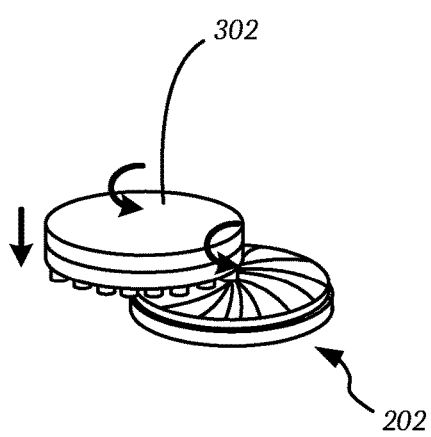
FIGS. 3A-3C illustrate a process of manufacturing a wafer, in accordance with at least one example of the present disclosure.
Figure 3B:
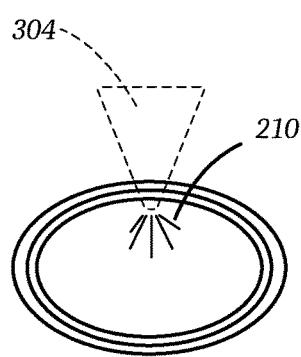
Figure 3C:
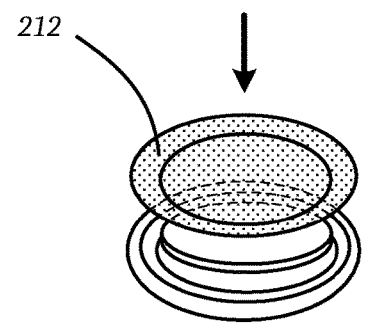

FIG. 3A illustrates a process of manufacturing a wafer. FIG. 3B illustrates a process of applying a coating to the wafer. FIG. 3C illustrates a process of applying an adhesive to the wafer. FIGS. 3A-3C are discussed below concurrently.

In producing or manufacturing, processes can be used to create die 110. For example, as shown in FIG. 3, microelectronic assembly 202 can be thinned using thinning apparatus 302, as shown in FIG. 3A. Thereafter, matching layer 210 can be sprayed by spraying apparatus 304 onto microelectronic assembly 202. Thereafter, adhesive 212 can be applied to microelectronic assembly 202, as shown in FIG. 3C.

Figure 4:
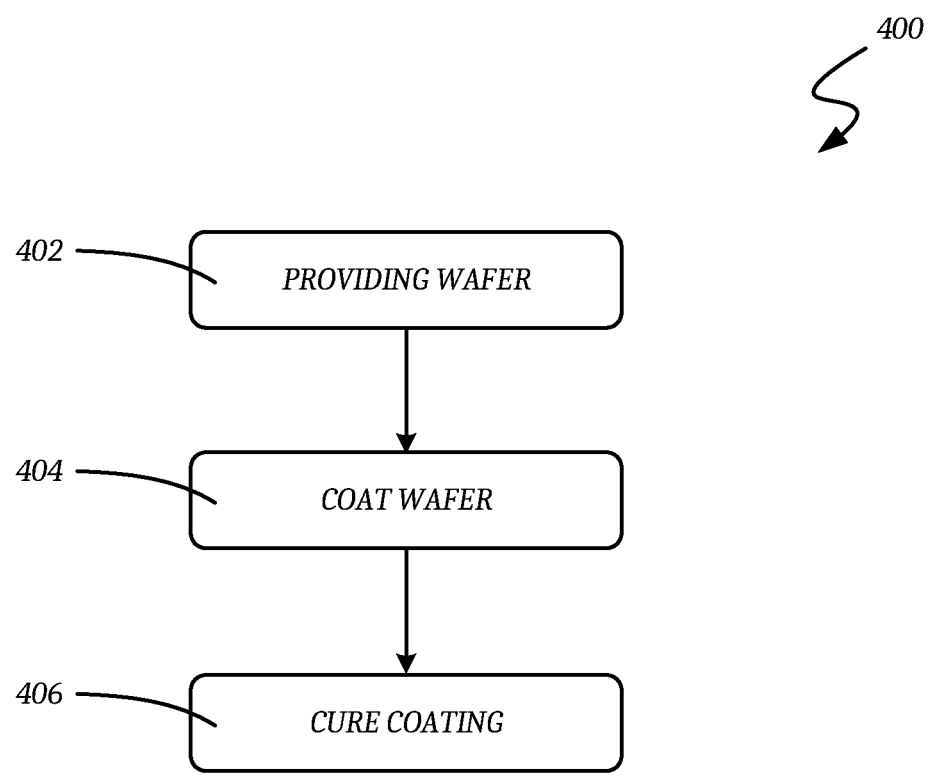
FIG. 4 illustrates a flow chart of a method, in accordance with at least one example of the present disclosure.

FIG. 4 illustrates a flow chart of method 400, a method of forming a microelectronic device, in accordance with at least one example of the present disclosure. The operations of method 400 are illustrated in a particular order for convenience and clarity. Many of the discussed operations can be performed in a different sequence or in parallel without materially impacting other operations. Method 400, as discussed, includes operations performed by multiple different actors, devices, and/or systems. It is understood that subsets of the operations discussed in method 400 attributable to a single actor, device, or system could be considered a separate standalone process or method. At operation 402 a thin wafer, such as microelectronic assembly 202 of FIG. 2 can be provided. Also, a coating, such as matching layer 210 of FIG. 2, can be sprayed or otherwise applied to microelectronic assembly 202 at step 404. At operation 406, the coating can be cured using various curing methods, such as heating, ultraviolet activation, cooling, and other curing processes.

More specifically, operation 402 can include providing a wafer including a polymer layer having a first coefficient of thermal expansion, a distribution layer including a second coefficient of thermal expansion, and a semiconductor. At operation 404, the semiconductor can be coated with a material having a third coefficient of thermal expansion that is about the same as one or more of the first coefficient of thermal expansion and the second coefficient of thermal expansion. At operation 406, the material can be cured. Methods containing additional operations can also be performed on the devices disclosed herein, as discussed in further detail below.

Figure 5:
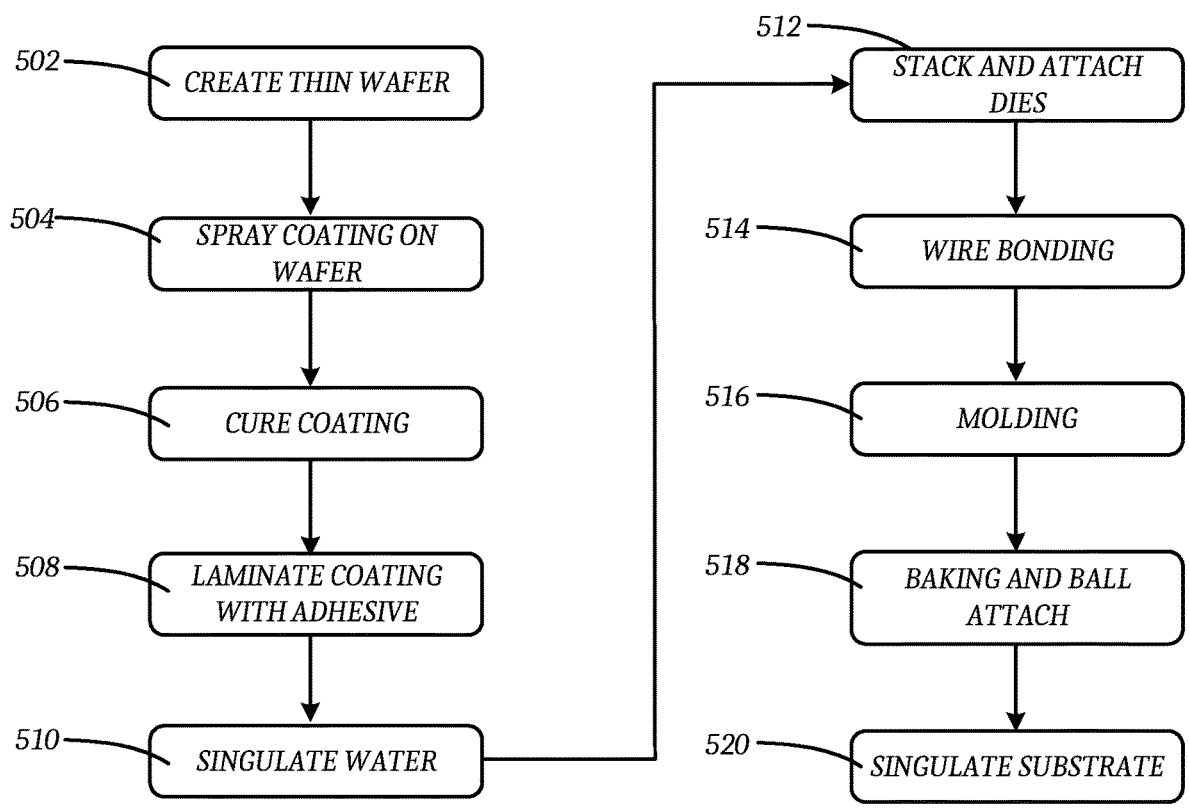
FIG. 5 illustrates a flow chart of a method, in accordance with at least one example of the present disclosure.

FIG. 5 illustrates a flow chart of method 500 in accordance with at least one example of the present disclosure. The operations or operations of method 500 are illustrated in a particular order for convenience and clarity. Many of the discussed operations can be performed in a different sequence or in parallel without materially impacting other operations. Method 500, as discussed, includes operations performed by multiple different actors, devices, and/or systems. It is understood that subsets of the operations discussed in method 500 attributable to a single actor, device, or system could be considered a separate standalone process or method.

At operation 502 a thin wafer, such as microelectronic assembly 202 of FIG. 2 can be created or provided. Thereafter, a coating, such as matching layer 210 of FIG. 2, can be sprayed or otherwise applied to microelectronic assembly 202 at operation 504. At operation 506 the coating can be cured. Thereafter, at operation 508, an adhesive, such as adhesive 212, can be laminated, or otherwise attached, to the coating. After processing of the wafer is complete, the wafer can be singulated (or otherwise separated into pieces) at operation 510 to form a plurality of dies, such as dies 110 of FIG. 1. The wafer can be singulated using, for example, a standard sawing process.

Application of the coating, such as matching layer 210, to a wafer followed by a singulation process is an improvement in processing and manufacturing that can enable the benefits of the present disclosure discussed above. Presence of the methods disclosed herein can be, in some cases, detected in final products by a number of methods, such as looking for saw marks in edges of the layers after singulation, and inspecting a cross-section of a die to determine if there are layers of material applied to the wafer, opposite the circuit and polymer layers.

After singulation, dies 110 can be stacked on each other, where dies 110 are also attached to each other at operation 512. The stack of dies 110 can also be attached to a substrate, such as substrate 102 of FIG. 1. At operation 514 conductors or wires can be bonded to the substrate and dies in a bonding process. Thereafter, at operation 516 a molding process can be performed, where an encapsulation layer, such as encapsulation 108 of FIG. 1, is applied to a top side of the substrate to encapsulate the dies and the conductors. At operation 518, the package can be baked and solder balls can be attached to a bottom side of the substrate. Finally the substrate can be singulated to form multiple packages at operation 520.

Figure 6:
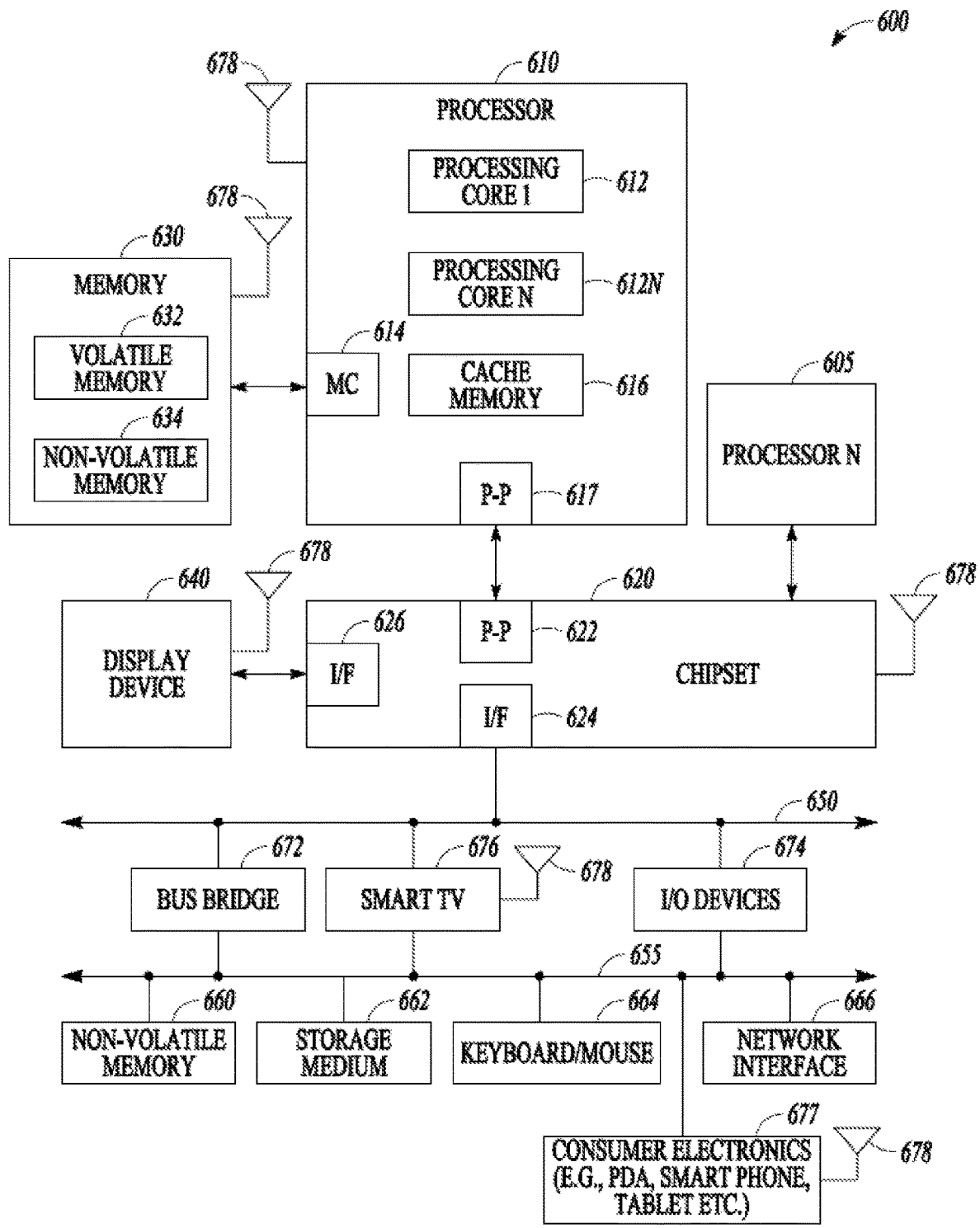
FIG. 6 illustrates a system level diagram, in accordance with at least one example of the present disclosure.

FIG. 6 illustrates a system level diagram, according to one example of the disclosure. For instance, FIG. 6 depicts an example of an electronic device (e.g., system) examples and methods described in embodiments above, such as package 100 and die 110 and associated methods, as described in the present disclosure above. FIG. 6 is included to show an example of a higher level device application for the present disclosure. In one embodiment, system 600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 600 is a system on a chip (SOC) system.

In one embodiment, processor 610 has one or more processing cores 612 and 612N, where 612N represents the Nth processor core inside processor 610 where N is a positive integer. In one embodiment, system 600 includes multiple processors including 610 and 605, where processor 605 has logic similar or identical to the logic of processor 610. In some embodiments, processing core 612 includes, but is not limited to, pre-fetch logic to fetch instructions, decode logic to decode the instructions, execution logic to execute instructions and the like. In some embodiments, processor 610 has a cache memory 616 to cache instructions and/or data for system 600. Cache memory 616 may be organized into a hierarchal structure including one or more levels of cache memory.

In some embodiments, processor 610 includes a memory controller 614, which is operable to perform functions that enable the processor 610 to access and communicate with memory 630 that includes a volatile memory 632 and/or a non-volatile memory 634. In some embodiments, processor 610 is coupled with memory 630 and chipset 620. Processor 610 may also be coupled to a wireless antenna 678 to communicate with any device configured to transmit and/or receive wireless signals. In one embodiment, the wireless antenna interface 678 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 634 includes, but is not limited to, flash memory, phase change memory (PCM), read-only memory (ROM), electrically erasable programmable read-only memory (EEPROM), or any other type of non-volatile memory device.

Memory 630 stores information and instructions to be executed by processor 610. In one embodiment, memory 630 may also store temporary variables or other intermediate information while processor 610 is executing instructions. In the illustrated embodiment, chipset 620 connects with processor 610 via Point-to-Point (PtP or P-P) interfaces 617 and 622. Chipset 620 enables processor 610 to connect to other elements in system 600. In some embodiments of the disclosure, interfaces 617 and 622 operate in accordance with a PtP communication protocol such as the Intel® QuickPath Interconnect (QPI) or the like. In other embodiments, a different interconnect may be used.

In some embodiments, chipset 620 is operable to communicate with processor 610, 605N, display device 640, and other devices 672, 676, 674, 660, 662, 664, 666, 677, etc. Chipset 620 may also be coupled to a wireless antenna 678 to communicate with any device configured to transmit and/or receive wireless signals.

Chipset 620 connects to display device 640 via interface 626. Display 640 may be, for example, a liquid crystal display (LCD), a plasma display, cathode ray tube (CRT) display, or any other form of visual display device. In some embodiments of the disclosure, processor 610 and chipset 620 are merged into a single SOC. In addition, chipset 620 connects to one or more buses 650 and 655 that interconnect various elements 674, 660, 662, 664, and 666. Buses 650 and 655 may be interconnected together via a bus bridge 672. In one embodiment, chipset 620 couples with a non-volatile memory 660, a mass storage device(s) 662, a keyboard/mouse 664, and a network interface 666 via interface 624 and/or 604, smart TV 676, consumer electronics 677, etc.

In one embodiment, mass storage device 662 includes, but is not limited to, a solid state drive, a hard disk drive, a universal serial bus flash memory drive, or any other form of computer data storage medium. In one embodiment, network interface 666 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 6 are depicted as separate blocks within the system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of 616) can be incorporated into processor core 612.

Further Notes and Examples

To better illustrate the methods and apparatuses described herein, a non-limiting set of example embodiments are set forth below as numerically identified examples:

Example 1 is a microelectronic device comprising: a polymer layer including a first coefficient of thermal expansion; a semiconductor coupled to the polymer layer; a matching layer adjacent the semiconductor opposite the polymer layer, the matching layer including a second coefficient of thermal expansion that is about the same as the first coefficient of thermal expansion.

In Example 2, the subject matter of Example 1 optionally includes a signal distribution layer disposed between the polymer layer and the semiconductor.

In Example 3, the subject matter of any one or more of Examples 1-2 optionally include wherein the signal distribution layer includes a third coefficient of thermal expansion, and wherein the second coefficient of thermal expansion is about the same as the third coefficient of thermal expansion.

In Example 4, the subject matter of any one or more of Examples 1-3 optionally include wherein the second coefficient of thermal expansion is between 15 and 25 parts per million per Kelvin.

In Example 5, the subject matter of any one or more of Examples 1-4 optionally include wherein the matching layer is comprised of one of a polyimide or an epoxy resin.

In Example 6, the subject matter of any one or more of Examples 1-5 optionally include wherein the matching layer comprises a thickness of about 5 to about 10 microns.

In Example 7, the subject matter of any one or more of Examples 1-6 optionally include an adhesive laminated to the matching layer.

In Example 8, the subject matter of any one or more of Examples 1-7 optionally include wherein the microelectronic device is a NAND die.

Example 9 is a microelectronic device comprising: a polymer layer; a semiconductor spaced from the polymer layer; a signal distribution layer disposed between the polymer layer and the semiconductor, the signal distribution layer including a first coefficient of thermal expansion; a matching layer adjacent the semiconductor opposite the signal distribution layer, the matching layer including a second coefficient of thermal expansion that is about the same as the first coefficient of thermal expansion.

In Example 10, the subject matter of Example 9 optionally includes wherein the polymer layer includes a third coefficient of thermal expansion, and wherein the second coefficient of thermal expansion that is about the same as the third coefficient of thermal expansion.

In Example 11, the subject matter of any one or more of Examples 9-10 optionally include wherein the second coefficient of thermal expansion is between 15 and 25 parts per million per Kelvin.

In Example 12, the subject matter of any one or more of Examples 9-11 optionally include wherein the matching layer is comprised of one of a polyimide or an epoxy resin.

In Example 13, the subject matter of any one or more of Examples 9-12 optionally include microns.

Example 14 is a microelectronic device package, comprising: a substrate including a plurality of conductive elements; a plurality of NAND modules oriented in a stacked configuration relative to the substrate, each NAND module electrically connected to one of the plurality of conductive elements, each NAND module comprising: a polymer layer including a first coefficient of thermal expansion; a semiconductor; a signal distribution layer disposed between the semiconductor and the polymer layer, the signal distribution layer including a second coefficient of thermal expansion; and a matching layer adjacent the semiconductor and opposite the signal distribution layer, the matching layer including a third coefficient of thermal expansion that is about the same as one or more of the first coefficient of thermal expansion and the second coefficient of thermal expansion; and an encapsulation layer enclosing the plurality of NAND modules.

In Example 15, the subject matter of Example 14 optionally includes wherein a thickness of the matching layer and the third coefficient of thermal expansion are selected as a function of the first coefficient of thermal expansion and the second coefficient of thermal expansion.

In Example 16, the subject matter of any one or more of Examples 14-15 optionally include wherein the third coefficient of thermal expansion is between 15 and 25 parts per million per Kelvin.

In Example 17, the subject matter of any one or more of Examples 14-16 optionally include wherein the matching layer is sprayed onto the substrate.

In Example 18, the subject matter of any one or more of Examples 14-17 optionally include microns.

In Example 19, the subject matter of any one or more of Examples 14-18 optionally include an adhesive laminated to the matching layer.

Example 20 is a method of forming a microelectronic device, comprising: providing a wafer comprising a polymer layer including a first coefficient of thermal expansion, a distribution layer including a second coefficient of thermal expansion, and a semiconductor; coating the semiconductor with a material having a third coefficient of thermal expansion that is about the same as one or more of the first coefficient of thermal expansion and the second coefficient of thermal expansion; and curing the material.

In Example 21, the subject matter of Example 20 optionally includes laminating the material with an adhesive.

In Example 22, the subject matter of Example 21 optionally includes singulating the wafer, creating a plurality of dies; and stacking and attaching the plurality of dies from the wafer to each other and to a package substrate.

In Example 23, the subject matter of Example 22 optionally includes bonding a conductor to each of the dies at a first end of each conductor and to the package substrate at a second end of each conductor; encapsulating the package and attaching a ball grid array to the package substrate; and singulating the package substrate.

Example 24 is a microelectronic device package, comprising: a substrate including a plurality of conductive elements; a plurality of NAND modules oriented in a stacked configuration relative to the substrate, each NAND module electrically connected to one of the plurality of conductive elements, each NAND module comprising: a polymer layer including a first coefficient of thermal expansion; a semiconductor; a matching layer adjacent the semiconductor and opposite the signal distribution layer, the matching layer including a second coefficient of thermal expansion that is about the same as the first coefficient of thermal expansion; and an encapsulation layer enclosing the plurality of NAND modules.

In Example 25, the subject matter of Example 24 optionally includes each NAND module further comprising: a signal distribution layer disposed between the semiconductor and the polymer layer, the signal distribution layer including a third coefficient of thermal expansion; wherein the second coefficient of thermal expansion is about the same as the third coefficient of thermal expansion.

The above detailed description includes references to the accompanying drawings, which form a part of the detailed description. The drawings show, by way of illustration, specific embodiments in which the disclosure can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An electronic device comprising a plurality of die including a first die and a second die, each of the plurality of die comprising:
   a first layer including a first polymer material and one or more electrical traces,
   wherein the first polymer material has a first coefficient of thermal expansion; a second layer including a semiconductor material,
   wherein the first layer is attached to a first side of the second layer;
   a third layer including a second polymer material having a second coefficient of thermal expansion,
   wherein the third layer is attached to a second side of the second layer and wherein the second coefficient of thermal expansion is between about 15 and about 25 parts per million per Kelvin; and
   wherein the first coefficient of thermal expansion is substantially similar to the second coefficient of thermal expansion.

2. The electronic device of claim 1, wherein the first coefficient of thermal expansion is substantially similar to the second coefficient of thermal expansion to balance stresses applied to the first side of the second layer with stresses applied to the second side of the second layer.

3. The electronic device of claim 1, wherein the first coefficient of thermal expansion is substantially similar to the second coefficient of thermal expansion to inhibit warping of the second layer.

4. The electronic device of claim 1, wherein the first layer includes a first side and a second side and the second layer is attached to the first side of the first layer, the electronic device further comprising:
   a fourth layer including a third polymer material having a third coefficient of thermal expansion wherein the fourth layer is attached to the second side of the first layer; and
   wherein the third coefficient of thermal expansion is substantially similar to the first coefficient of thermal expansion and the second coefficient of thermal expansion.

5. The electronic device of claim 1, further comprising an adhesive layer attached to the third layer.

6. The electronic device of claim 1, wherein the third layer includes one or more of a polyimide or an epoxy resin.

7. The electronic device of claim 1, further comprising a substrate, wherein the first layer is located between the substrate and the second layer.

8. An electronic device, comprising a plurality of die including a first die and a second die, each of the plurality of die comprising:
   a first layer including a first polymer material and one or more electrical traces,
   wherein the first polymer material has a first coefficient of thermal expansion; a second layer including a semiconductor material,
   wherein the first layer is attached to a first side of the second layer; a third layer including a second polymer material having a second coefficient of thermal expansion, wherein the third layer is attached to a second side of the second layer;
   wherein the first coefficient of thermal expansion is substantially similar to the second coefficient of thermal expansion; and
   wherein the third layer has a thickness of about 5 microns to about 10 microns.

9. An electronic device, comprising a plurality of die including a first die and a second die, each of the plurality of die comprising:
   a first layer including a first polymer material and one or more electrical traces, wherein the first polymer material has a first coefficient of thermal expansion;
   a second layer including a semiconductor material, wherein the first layer is attached to a first side of the second layer;
   a third layer including a second polymer material having a second coefficient of thermal expansion, wherein the third layer is attached to a second side of the second layer;

wherein the first coefficient of thermal expansion is substantially similar to the second coefficient of thermal expansion; and wherein the third layer does not include a conductive material.

10. An electronic device, comprising:
a plurality of die including a first die attached to a second die, each of the plurality of die including:
  a first layer including a first polymer material and one or more electrical traces, wherein the first polymer material has the first coefficient of thermal expansion;
  a second layer including a semiconductor material, wherein the first layer is attached to a first side of a second layer;
  a third layer including a second polymer material having a second coefficient of thermal expansion, wherein the third layer is attached to a second side of the second layer;
  wherein the first coefficient of thermal expansion is substantially similar to the second coefficient of thermal expansion; and
  wherein the first layer of each of the plurality of die includes a first side and a second side and the second layer of each of the plurality of die is attached to the first side of the first layer, wherein each of the plurality of die includes:
    a fourth layer including a third polymer material having a third coefficient of thermal expansion, wherein the fourth layer is attached to the second side of the first layer; and
    wherein the third coefficient of thermal expansion is substantially similar to the first coefficient of thermal expansion and substantially similar to the second coefficient of thermal expansion.

11. An electronic device, comprising:
a plurality of die including a first die attached to a second die, each of the plurality of die including:
  a first layer including a first polymer material and one or more electrical traces, wherein the first polymer material has the first coefficient of thermal expansion;
  a second layer including a semiconductor material, wherein the first layer is attached to a first side of a second layer;
  a third layer including a second polymer material having a second coefficient of thermal expansion, wherein the third layer is attached to a second side of the second layer;
  wherein the first coefficient of thermal expansion is substantially similar to the second coefficient of thermal expansion; and
a substrate, wherein the first die is located between the substrate and the second die.

12. The electronic device of claim 11, further comprising one or more conductors coupled between the first die and the substrate.

13. An electronic device, comprising:
a plurality of die including a first die attached to a second die, each of the plurality of die including:
  a first layer including a first polymer material and one or more electrical traces, wherein the first polymer material has the first coefficient of thermal expansion;
  a second layer including a semiconductor material, wherein the first layer is attached to a first side of a second layer;
  a third layer including a second polymer material having a second coefficient of thermal expansion, wherein the third layer is attached to a second side of the second layer; and
  wherein the first coefficient of thermal expansion is substantially similar to the second coefficient of thermal expansion, and the second die is stacked upon the first die.

14. The electronic device of claim 13, further comprising an adhesive located between the first die and the second die, wherein the adhesive is configured to attach the first die with the second die.

15. An electronic device, comprising:
a substrate, and
a plurality of die including a first die and a second die, each of the plurality of die including:
a first layer including a first polymer material and one or more electrical traces, wherein the first polymer material has a first coefficient of thermal expansion;
a second layer including a semiconductor material, wherein the first layer is attached to a first side of the second layer; and
a third layer including a second polymer material having a second coefficient of thermal expansion, wherein the third layer is attached to a second side of the second layer;
a fourth layer including a third polymer material having a third coefficient of thermal expansion, wherein the fourth layer is attached to the first layer opposite the second layer; and
wherein each of the first coefficient of thermal expansion, the second coefficient of thermal expansion, and the third coefficient of thermal expansion are substantially similar.

16. The electronic device of claim 15 wherein each of the first coefficient of thermal expansion, the second coefficient of thermal expansion, and the third coefficient of thermal expansion are substantially similar to balance stresses applied to the first side of the second layer with stresses applied to the second side of the second layer.

17. The electronic device of claim 15 wherein each of the first coefficient of thermal expansion, the second coefficient of thermal expansion, and the third coefficient of thermal expansion are substantially similar to inhibit warping of the second layer.

18. The electronic device of claim 15, further comprising an encapsulation material coupled with the plurality of die and the substrate.

* * * * *

UNITED STATES PATENT AND TRADEMARK OFFICE
CERTIFICATE OF CORRECTION

PATENT NO. : 11,848,281 B2
APPLICATION NO. : 17/391612
DATED : December 19, 2023
INVENTOR(S) : Yong She et al.

It is certified that error appears in the above-identified patent and that said Letters Patent is hereby corrected as shown below:

In the Claims

In Column 14, Claim 16, Line 43, delete "claim 15" and insert -- claim 15, -- therefor.

In Column 14, Claim 17, Line 49, delete "claim 15" and insert -- claim 15, -- therefor.

Signed and Sealed this
Twenty-third Day of January, 2024

Katherine Kelly Vidal
*Director of the United States Patent and Trademark Office*